United States Patent [19]
Linder et al.

[11] Patent Number: 5,963,094
[45] Date of Patent: Oct. 5, 1999

[54] MONOLITHIC CLASS AB SHUNT-SHUNT FEEDBACK CMOS LOW NOISE AMPLIFIER HAVING SELF BIAS

[75] Inventors: Lloyd F. Linder, Agoura Hills; Kelvin T. Tran, Carson, both of Calif.

[73] Assignee: Raytheon Company, Lexington, Mass.

[21] Appl. No.: 09/027,241

[22] Filed: Feb. 20, 1998

[51] Int. Cl.$^6$ ................................. H03F 3/18; H03F 3/26
[52] U.S. Cl. ............................................. 330/264; 330/265
[58] Field of Search .................................... 330/264, 265, 330/267, 270

[56] References Cited

U.S. PATENT DOCUMENTS 4,087,760   5/1978   Yokoyama .............................. 330/265
4,353,036  10/1982   Hoover ................................... 330/264

Primary Examiner—Robert Pascal
Assistant Examiner—Patricia T. Nguyen
Attorney, Agent, or Firm—Leonard A. Alkov; William C. Schubert; Glenn H. Lenzen, Jr.

[57] ABSTRACT

A monolithic class AB (push-pull) low noise amplifier having feedback and self bias. The low noise amplifier exhibits low power, high intercept point, low noise figure, well matched terminal impedances over wide range of frequency, and may be monolithically implemented. The amplifier may be produced using CMOS process technologies. The amplifier comprises NMOS and PMOS transistors serially coupled between a voltage rail and ground. The amplifier uses self biasing embodied in a bias resistor coupled between an input shunt capacitor and respective drains of the NMOS and PMOS transistors, which allows for maximum gate-to-source voltage and higher transconductance for a minimum aspect ratio (W/L). This results in a wider bandwidth and reduced power for the amplifier. The use of a shunt—shunt feedback network comprising a shunt resistor and a serially coupled shunt capacitor coupled between respective gates and drains of the NMOS and PMOS transistors, provides better terminal impedance matching over wide bandwidth.

9 Claims, 2 Drawing Sheets

MONOLITHIC CLASS AB SHUNT-SHUNT FEEDBACK CMOS LOW NOISE AMPLIFIER HAVING SELF BIAS

BACKGROUND

The present invention relates generally to class AB amplifiers, and more particularly, to a monolithic class AB low noise amplifier having feedback and self bias. The preferred application of such a circuit is for (monolithic low cost high dynamic range, low noise CMOS) FR receivers used in FM stereo systems, although performance can extend to higher frequency ranges.

Conventional open-loop class AB amplifier architectures have a number of limitations, as is illustrated in a typical prior art design shown in FIG. 1. Such limitations include a complicated biasing scheme that requires active devices (transistors $M_B$, $M_2$, $M_3$, and a bias network IREF (not shown)) to bias-up input gate voltages of NMOS ($M_1$) and PMOS ($M_2$) devices. A common mode amplifier (transistors $M_4$–$M_7$) is also needed to bias the DC operating point at the output. The common mode amplifiers are required to set up a DC voltage of $V_{B1}$ at $V_{OUT1}$ and $V_{B2}$ at $V_{OUT2}$. The NMOS and PMOS ($M_1$, $M_2$) devices do not receive adequate gate-to-source voltage ($V_{gs}$) for the desired current for a given aspect ratio (W/L) and results in a lower transconductance (gm).

The open-loop class AB design of in the prior art class AB amplifier architecture of FIG. 1 achieves high gain using a two-stage cascade approach. Problems associated with the cascading design involves an interstage that does not match impedance (resulting from directly coupled stages), making the gain and seminal impedances of the amplifier highly process dependent. Also, prior art amplifiers require multiple stages to achieve high gain. Another limitation is that an AC decoupling network ($C_1$–$C_4$) only allows the amplifier to work at high frequencies in a narrow bandwidth. It is therefore difficult for the amplifier to work at FM frequencies due to the size of the capacitor in the AC decoupling network. An external matching network ($M_B$, $M_L$) is also required to match the respective input and output ports of the low noise amplifier to 50 ohms, and due to the lack of feedback, are also only narrowband matches. The feedback structure of the present invention allows matching over a wide bandwidth.

Accordingly, it is an objective of the present invention to provide for an improved monolithic class AB low noise amplifier having feedback and self bias that allows impedance matching over a wide bandwidth. It is also an objective of the present invention to provide for an improved monolithic class AB low noise amplifier wherein feedback allows a reduction in sensitivity to process variations for the desired impedance match.

SUMMARY OF THE INVENTION

To accomplish the above and other objectives, the present invention provides for a monolithic class AB low noise amplifier having feedback and self bias. The present invention provides for a low noise amplifier that exhibits low power, high intercept point, low noise figure, well matched terminal impedances over wide range of frequency, and may be monolithically implemented. It is a class AB (push-pull) shunt—shunt feedback amplifier having a self-biasing scheme. The present invention may be produced using CMOS process technologies. A first important feature of the present invention is self biasing, which allows for maximum gate-to-source voltage ($V_{gs}$) and higher transconductance (gm) for a minimum aspect ratio (W/L) which results in a wider bandwidth and power reduction, and lower distortion due to lower device parasitics. A second important feature is the use of shunt—shunt feedback, which provides better terminal impedance matching over wide bandwidth.

The present invention simplifies the design of a low-noise amplifier, while maintaining its excellent dynamic capabilities, thus allowing the amplifier to be implemented monolithically without the need for external components. In recent class AB (push-pull) designs, such as the amplifier discussed in the Background section, limited performance is a result of device headroom and parasitic effect over a limited bandwidth imposed by the extra circuitry. The primary advantages of the present invention, over prior art amplifier designs, are as follows.

In the present amplifier, extra circuitry to dc bias the input gate voltage is no longer required, and this prior bias circuitry is replaced by a simple resistor $R_{BIAS}$. External input and output matching networks are no longer required. Maximum $V_{gs}$, gm and bandwidth for a minimum aspect ratio (W/L) can be achieved using the present invention. Production of the present amplifier is process insensitive to gain and terminal impedances because of the feedback used therein. The present amplifier also provides better power supply rejection.

The simplicity of the design of the class AB shunt—shunt feedback low-noise amplifier using a self-biasing scheme of the present invention, is that it combines high performance along with low power consumption, thereby providing for low production costs. The low-noise amplifier may be use as an RF front-end FM antenna receiver integrated circuit, for example. The architecture of the present invention provides for an amplifier that may be used in FM and HF frequency ranges for avionics applications. Channel lengths of CMOS transistors permit the use of the present amplifier architecture in applications in the UHF range that may be used in low cost digital receivers, including cellular telephone receivers, for example. The present amplifier may be utilized as part of any RF front-end that requires low power and noise figures, along with a high intercept point.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 2:
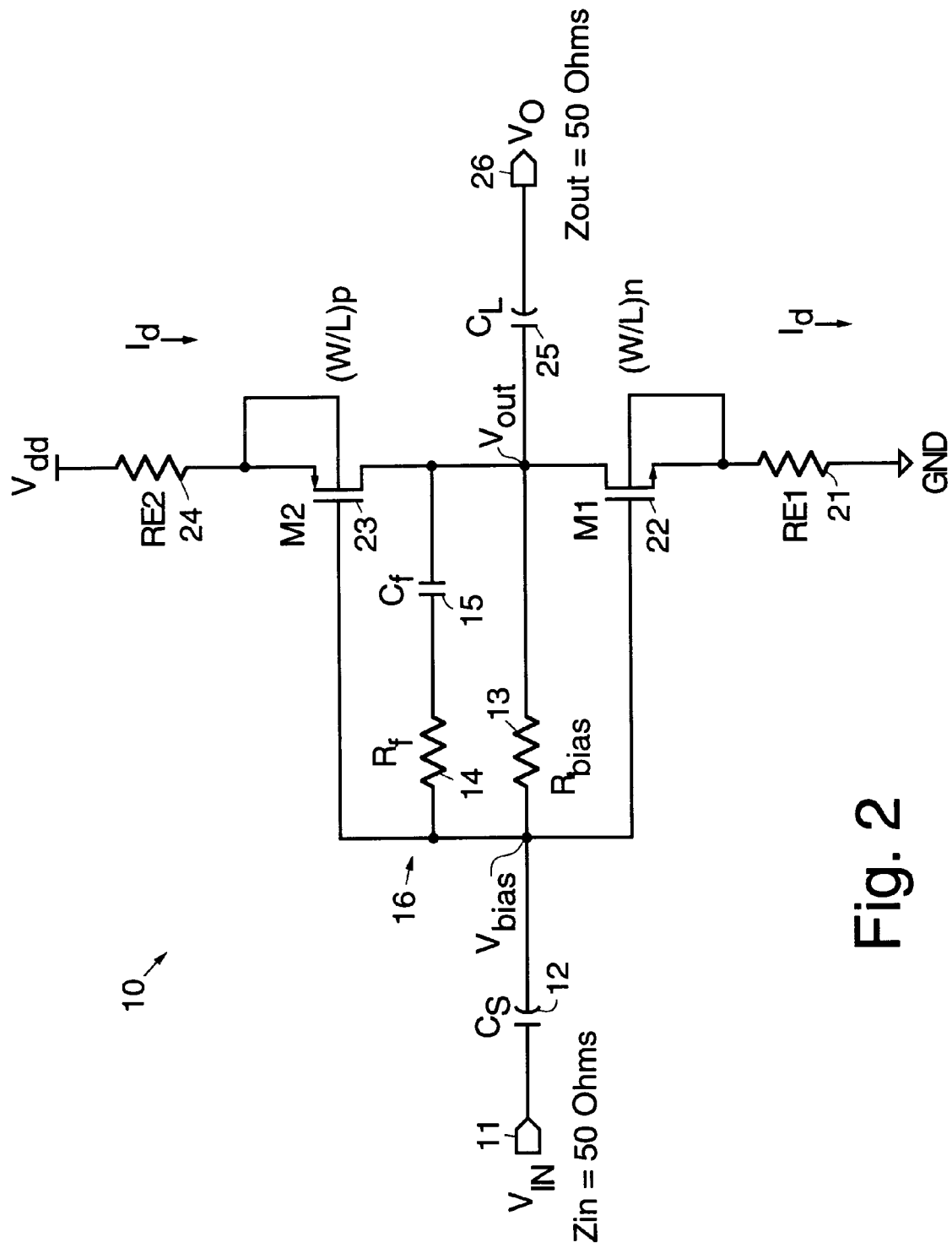
FIG. 2 illustrates a class AB low noise amplifier in accordance with the principles of the present invention.

Referring to FIG. 2, it is a schematic that illustrates a class AB low noise amplifier 10 in accordance with the principles of the present invention. The class AB low noise amplifier 10 comprises a voltage input 11 which is designed to have a 50 ohm input impedance that is coupled by way of a coupling capacitor ($C_s$) 12 to gates of NMOS and PMOS transistors ($M_1$, $M_2$) 22, 23, respectively. A bias voltage ($V_{bias}$) is provided using a single bias resistor ($R_{BIAS}$) 13 coupled between the coupling capacitor 12 and respective drains of the NMOS and PMOS transistors 22, 23, and which provides for self-biasing of the NMOS and PMOS transistors 22, 23.

Respective drains of the NMOS and PMOS transistors 22, 23 are coupled together and are coupled to the respective gates thereof by means of a shunt—shunt feedback network 16 comprising a shunt resistor ($R_f$) 14 and a serially coupled shunt capacitor ($C_f$) 15 and the bias resistor 13. A source of the NMOS transistor ($M_1$) 22 is coupled to ground (GND) by way of a first degeneration resistor ($RE_1$) 21. A source of the PMOS transistor ($M_2$) 23 is coupled to a voltage rail ($V_{dd}$) by way of a second degeneration resistor ($RE_2$) 24.

A bias resistor ($R_{bias}$) 13 is coupled between the coupling capacitor 12 and the respective drains of the NMOS and PMOS transistors 22, 23. The voltage output derived from the NMOS and PMOS transistors 22, 23 provides a voltage output that is coupled by way of a load capacitor ($C_L$) 25 to a voltage output 26 of the amplifier 10. The voltage output 26 is designed to have a 50 ohm output impedance.

The amplifier 10 has a class AB shunt—shunt feedback design with self-bias. The degeneration resistors 21, 24 are used to reduce the gain of the amplifier 10 and also reduces distortion thereof. However, it is to be understood that the amplifier 10 may be designed without the use of the degeneration resistors 21, 24 while still maintaining noise and distortion performance while sacrificing more power dissipation. Two key features of the amplifier 10 are its use of the self-biasing scheme and shunt—shunt feedback and will be discussed in more detail below.

The class AB architecture of the amplifier 10 has reduced power consumption for a given distortion performance. When compared to a common source amplifier, the drain current of the NMOS transistor ($M_1$) 22 is reused in the PMOS transistor ($M_2$) 23, and thus an increase in transconductance (gm) of the amplifier 10 is possible without increasing current consumption.

Figure 1:
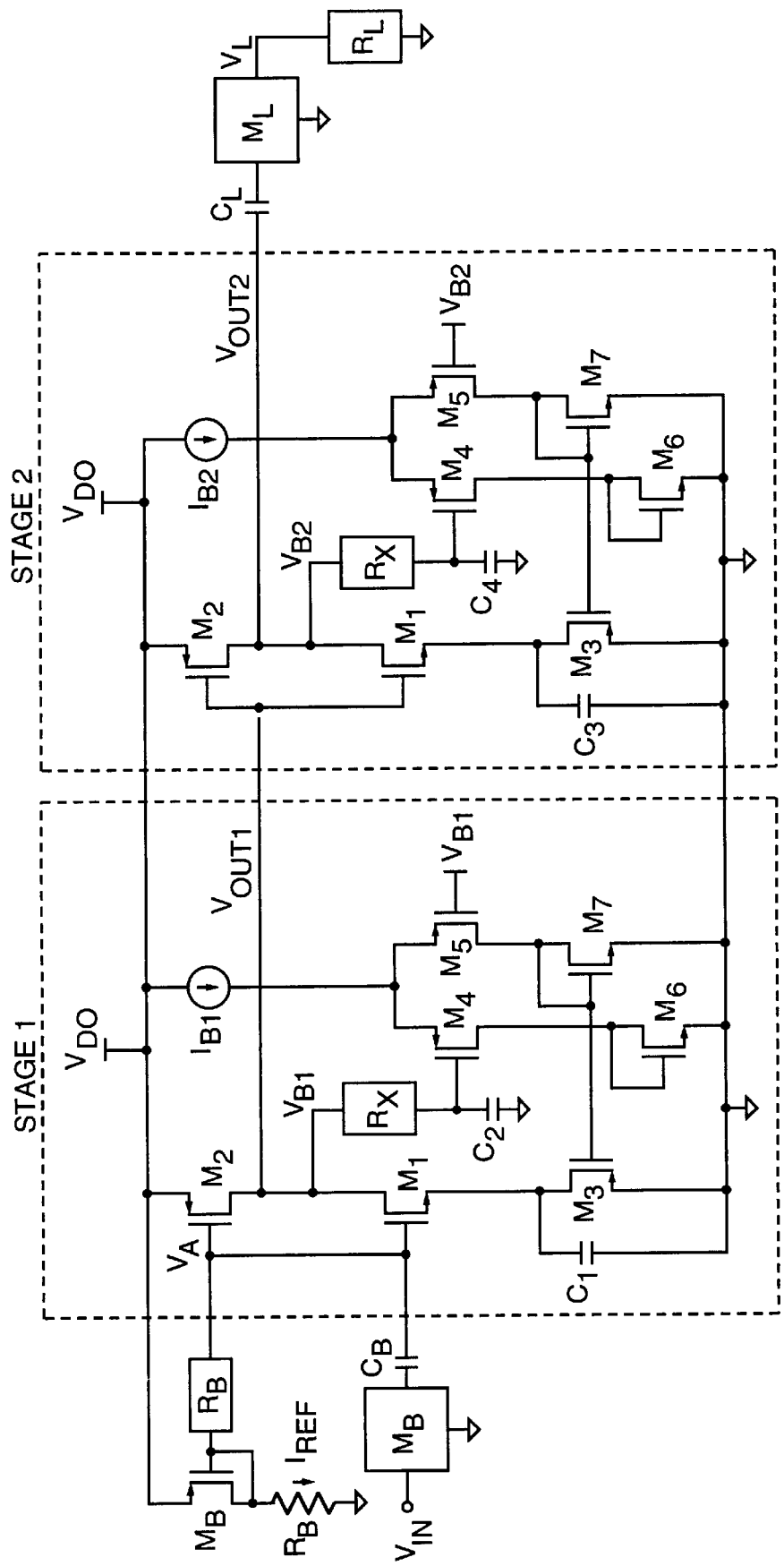
FIG. 1 illustrates a conventional open loop class AB low noise amplifier.

The amplifier 10 uses the self biasing scheme to minimize the complexity of conventional designs, such as the design shown in FIG. 1, without degrading performance. The addition of the self biasing scheme removes design complexity; thereby reducing power consumption and enhancing the performance of the amplifier 10.

Focusing on the self biasing scheme used in the amplifier 10, the bias resistor ($R_{bias}$) 13 disposed between the input and output voltage nodes ($V_{bias}$, $V_{out}$) forces the output voltage node ($V_{out}$) to be at the same potential as the input voltage node $V_{bias}$. The voltage ($V_{bias}$) can be determined as follows:

$$I(RE_1) + V_{gs}(n) + I(RE_2) + V_{gs}(p) = V_{dd},$$

and if it is assumed that the degeneration resistors 21, 24 are very low valued, then:

$$V_{dd} = V_{gs}(n) + V_{gs}(p).$$

For $V_{gs}(n) = V_{gs}(p)$, $$V_{dd} = 2V_{gs}, \text{ and } V_{BIAS} = V_{dd}/2 \qquad \text{Eq. 1}$$

$$I_d = (\tfrac{1}{2})\mu n(C_{ox})(W/L)(V_{gs}-V_t)^2, \text{ and} \qquad \text{Eq. 2}$$

$$gm = \mu n(C_{ox})(W/L)(V_{gs}-V_t). \qquad \text{Eq. 3}$$

In the above equations, $I_d$ is the current flowing between the voltage rail ($V_{dd}$) and ground, (W/L) is the aspect ratio of the respective transistors 22, 23, $V_{gs}$ is the gate-to-source voltage, $V_t$ is the threshold voltage, $\mu n$ is the electron mobility, and ($C_{ox}$) is gate oxide capacitance per unit area.

According to equation 1, $V_{gs}$ for each transistor 22, 23 can be as high as $V_{dd}/2$, which allows flexibility to optimize the design of the amplifier 10. This self-biasing scheme allows a maximum $V_{gs}$ (Eq. 2) for minimum aspect ratio (W/L), and the transconductance of the amplifier 10 (Eq. 3) can also increase without increasing current consumption, which results in wider bandwidth and high gain and lower distortion. Power supply rejection is also improved, compared with previously used architectures, because voltage supply modulation is not coupled into the circuit, as is the case with the prior art.

Shunt—shunt feedback is incorporated into the amplifier 10 to provide for impedance matching control. The shunt resistor ($R_f$) 14 and shunt capacitor ($C_f$) 15 form the feedback network 16 that allows good terminal impedance matching over a wide bandwidth. The shunt resistor ($R_f$) 14 and shunt capacitor ($C_f$) 15 are disposed on-chip to provide for monolithic implementation.

Thus, an improved monolithic class AB low noise amplifier has been disclosed that incorporates feedback and self bias. It is to be understood that the described embodiment is merely illustrative of some of the many specific embodiments that represent applications of the principles of the present invention. Clearly, numerous and other arrangements can be readily devised by those skilled in the art without departing from the scope of the invention. For example, the present invention has been described with reference to the use of CMOS technology for its implementation. However, the present invention may readily be implemented by those skilled in the art using gallium arsenide, high electron mobility transistor (HEMT), or complementary bipolar technologies as well.

What is claimed is:

1. A class AB low noise amplifier comprising:

a voltage input;

a voltage output;

a load capacitor coupled to the voltage output;

NMOS and PMOS transistors serially coupled between a voltage rail and ground and having their respective drains coupled together and coupled to the load capacitor;

a shunt—shunt feedback network coupled between respective gates and the coupled drains of the NMOS and PMOS transistors; and a coupling capacitor coupled between the voltage input and the gates of the NMOS and PMOS transistors;

a bias resistor coupled between the coupling capacitor and the respective drains of the NMOS and PMOS transistors.

2. The class AB low noise amplifier of claim 1 wherein the voltage input has a 50 ohm input impedance.

3. The class AB low noise amplifier of claim 1 wherein the NMOS transistor has its source coupled to ground by way of a first degeneration resistor, and the PMOS transistor is coupled to the voltage rail by way of a second degeneration resistor.

4. The class AB low noise amplifier of claim 1 wherein the voltage output has a 50 ohm output impedance.

5. The class AB low noise amplifier of claim 1 wherein the shunt—shunt feedback network comprises a shunt resistor and a serially coupled shunt capacitor coupled between respective gates and drains of the NMOS and PMOS transistors.

6. The class AB low noise amplifier of claim 3 wherein the degeneration resistors reduce the gain and distortion of the amplifier.

7. The class AB low noise amplifier of claim 1 wherein the bias resistor disposed between input and output voltage nodes forces the output voltage of the respective transistors to be at the same potential as the input voltage to the respective transistors.

8. The class AB low noise amplifier of claim 1 wherein the shunt—shunt feedback network provides for impedance matching of the voltage input and output.

9. The class AB low noise amplifier of claim 1 wherein amplifier is a monolithic structure.

* * * * *